United States Patent
Perkey et al.

(10) Patent No.: US 8,824,114 B2
(45) Date of Patent: Sep. 2, 2014

(54) MONITOR CIRCUIT FOR DETERMINING THE LIFETIME OF A SEMICONDUCTOR DEVICE

(75) Inventors: Jason C. Perkey, Austin, TX (US);
Scott S. Roth, Austin, TX (US); Tim J. Zoerner, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 529 days.

(21) Appl. No.: 12/764,689

(22) Filed: Apr. 21, 2010

(65) Prior Publication Data
US 2011/0261491 A1 Oct. 27, 2011

(51) Int. Cl.
*H02H 3/00* (2006.01)
*G01R 31/26* (2014.01)
*H02H 3/22* (2006.01)
*H02H 9/00* (2006.01)
*H01L 21/768* (2006.01)

(52) U.S. Cl.
CPC ................................ *G01R 31/2642* (2013.01)
USPC ................. 361/78; 361/18; 361/111; 361/56; 438/598

(58) Field of Classification Search
CPC ........... G01R 31/2642; G01R 31/3004; H01L 27/0266
USPC .......................... 361/78, 56, 18, 111; 438/598
See application file for complete search history.

(56) References Cited

U.S. PATENT DOCUMENTS

| | | | |
|---|---|---|---|
| 6,433,616 B1 * | 8/2002 | Dishongh et al. | 327/525 |
| 6,441,675 B1 | 8/2002 | Dishongh et al. | |
| 6,627,969 B1 | 9/2003 | Jain et al. | |
| 6,927,411 B2 | 8/2005 | Kozicki | |
| 7,142,400 B1 * | 11/2006 | Williams et al. | 361/18 |
| 7,256,471 B2 | 8/2007 | Min et al. | |
| 7,321,978 B2 | 1/2008 | Brodsky | |
| 7,851,793 B2 * | 12/2010 | Wang et al. | 257/48 |
| 2006/0222059 A1 | 10/2006 | Ruff et al. | |

OTHER PUBLICATIONS

Wu, et al., "Modeling of Time-Dependent Dielectric Breakdown in Copper Metallization", IEEE Transactions on Device and Materials Reliability, vol. 3, No. 2, Jun. 2003.

* cited by examiner

*Primary Examiner* — Jared Fureman
*Assistant Examiner* — Lucy Thomas
(74) *Attorney, Agent, or Firm* — Dan D. Hill

(57) ABSTRACT

A circuit comprises a first conductor, a second conductor, and a first detect and disconnect circuit. The first conductor is coupled to a first power supply voltage terminal. The second conductor is positioned a first predetermined distance from the first conductor. The first detect and disconnect circuit has a first terminal coupled to the second conductor and a second terminal coupled to a second power supply voltage terminal. The first detect and disconnect circuit detects a first electrical property change between the second conductor and the first conductor. In response to detecting the change in the first electrical property, the second conductor is disconnected from the second power supply voltage terminal. A method for manufacturing a semiconductor device comprising the circuit is also provided.

17 Claims, 3 Drawing Sheets

MONITOR CIRCUIT FOR DETERMINING THE LIFETIME OF A SEMICONDUCTOR DEVICE

BACKGROUND

1. Field

This disclosure relates generally to forming semiconductor devices, and more specifically, to forming a lifetime monitor.

2. Related Art

Excessive voltage and/or extreme temperature conditions, which may be defined as overstress, cause semiconductor devices to fail earlier than expected. This is especially problematic in high performance devices where the semiconductor devices are exposed to excessive voltages, where "overclock" occurs when the voltage stated in the specification is purposely surpassed. This problem also arises in automotive applications where the semiconductor devices are exposed to very high temperatures due to their proximity to the engine. It is difficult to detect these undesirable conditions.

Prior art solutions for detecting excessive voltage and extreme temperature conditions are provided at the transistor level. The prior art utilizes clock edge counting or voltage comparators.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an overstress detection structure, which may include copper, is used to calculate the lifetime of the semiconductor device based on excessive voltage, extreme temperature conditions, other factors that affect dielectric property changes, or combinations of the above. If a product is returned to the semiconductor supplier, this structure can be used to easily determine if the product was subjected to overstress. In one embodiment, a plurality of conductive lines exists with varying spaces (and possibly varying lengths) between each of them and a conductive perpendicular line. The spaces between the lines consist of a dielectric material. As the property of the dielectric changes in a predictable manner due to voltage and temperature applied to the circuit, the change may result in overstress detection. The dielectric property change separating each line can determine to what voltage or temperature the semiconductor was exposed. In addition, other embodiments may be used to measure the dielectric property changes. In one embodiment, a cutoff detection circuit may be used to detect the dielectric change and disconnect either the power or ground connection in real time to avoid detecting further overstress. Thus, unlike the prior art, a measurement of stress to a circuit is possible.

Figure 1:
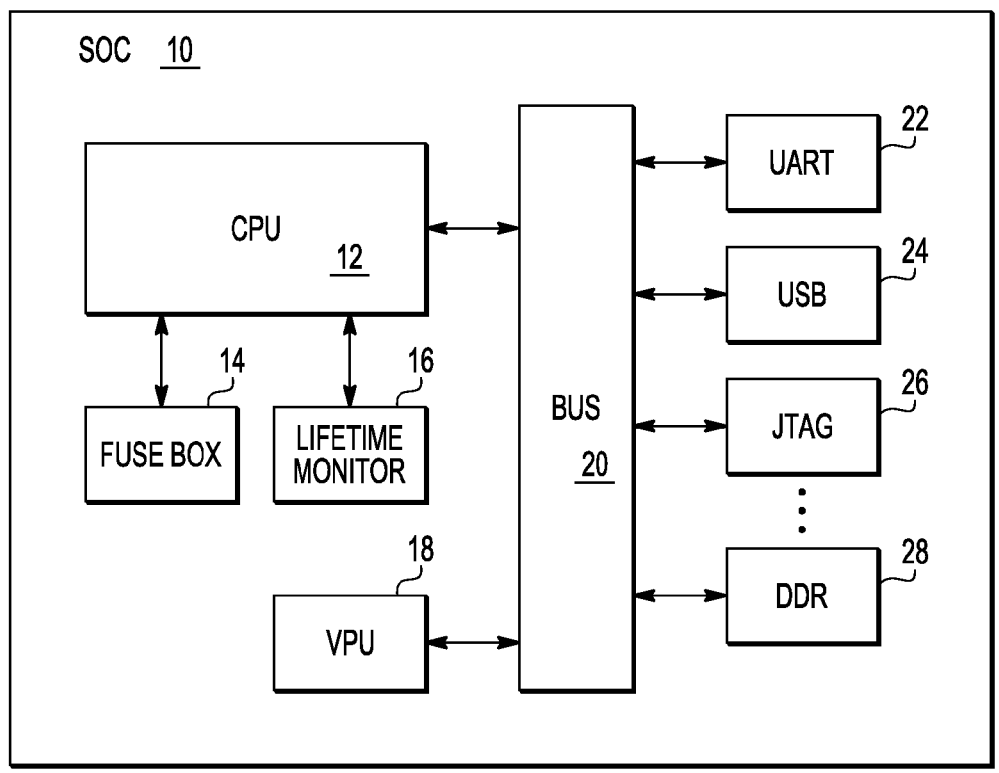
FIG. 1 illustrates a block diagram of a semiconductor device having a lifetime monitor in accordance with an embodiment of the present invention.

FIG. 1 illustrates a semiconductor device 10, which in the embodiment illustrated in a system on a chip (SOC). The SOC 10 is formed on or within a substrate. The SOC 10 may include a central processing unit (CPU) 12 for controlling the SOC 10 coupled to a bus 20 (which transports data), a fusebox 14 (which includes factory settings), and a lifetime monitor 16 (which monitors the overstress). The bus 20 is coupled to a Universal Asynchronous Receiver/Transmitter (UART) 22, which may translate data between parallel and serial forms; a Universal Serial Bus (USB) 24, which is a connector between a device and a host controller; a JTAG 26, which is a port used to debug the semiconductor device; Double Data Rate (DDR) 28, which is hardware used to transfer data; a video processing unit (VPU) 18 for manipulating computer graphics, and/or any other blocks, hardware, or modules.

Figure 2:
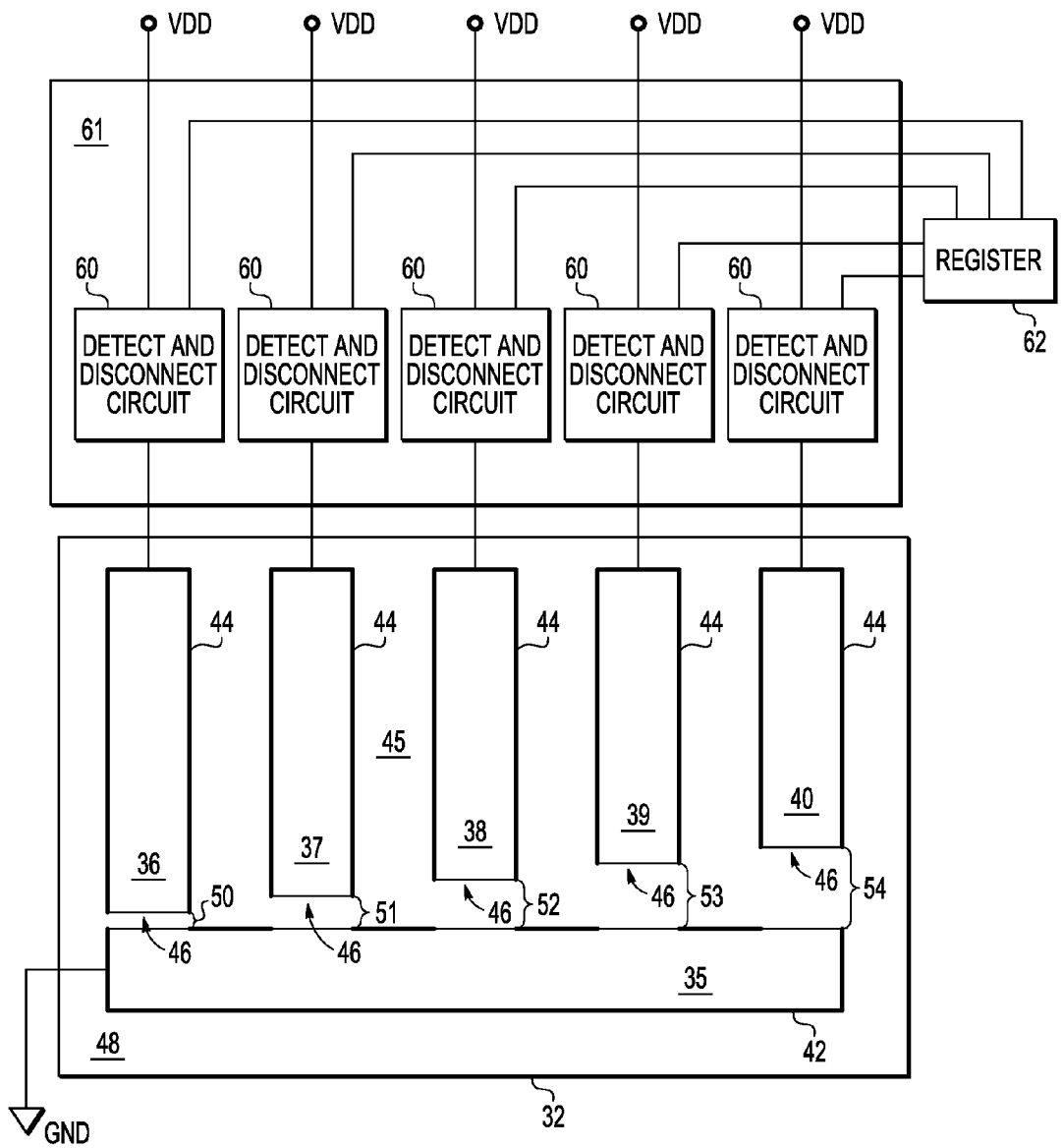
FIG. 2 illustrates the lifetime monitor of FIG. 1 in accordance with an embodiment of the present invention.

FIG. 2 illustrates the lifetime monitor 16 of FIG. 1 in accordance with one embodiment. In the embodiment illustrated, the lifetime monitor 16 includes conductors 35-40. A barrier layer 42 surrounds the first conductor 35, which is coupled to ground. In one embodiment, the first conductor 35 is copper and the barrier layer 42 is a material that will prevent the diffusion of copper, such as tantalum nitride or silicon nitride. The first conductor 35 may be another suitable material, such as aluminum, gold, or silver and the barrier layer 42 may be another material that prevents the diffusion of elements in the dielectric material 45. Each of the second to six conductors 36 to 40 are partially surrounded by a barrier layer 44. The same materials for the first conductor 35 and barrier layer 42 may be used for the second to six conductors 36 to 40 and the barrier layers 44, respectively. The barrier layers 42 and 44 may all be the same or different materials. Similarly, the conductors 35-40 may all be the same or different materials. A surface of the second to sixth conductors 36 to 40 that is closest to the first conductors 35 does not include the barrier layer 44, so that an element from the second to sixth conductors 36 to 40 (a diffusing species) will diffuse from the second to sixth conductors 36 to 40, which usefulness will be further explained below, from the exposed areas 46 of the second to sixth conductors 36-40.

The diffusing species will diffuse in the dielectric 45 towards the negative potential, which in the embodiment illustrated is ground. (Thus, in the embodiment illustrated in FIG. 2 if VDD and ground are switched, then the diffusing species will travel from the first conductor 35 to the second to sixth conductors 36 to 40. In this embodiment, all sides of the second to sixth conductors 36 to 40 will be surrounded by the barrier layer 44 and portions of the first conductor 35 that are across from the second to sixth conductors 36 to 40 will be devoid of the barrier layer 42 to enable the diffusion of the diffusing species (e.g., Cu).) The diffusing species would then be an impurity in the dielectric 45 in the region between the two conductors. The presence of the diffusing species in the dielectric 45 will alter the electrical properties of the lifetime monitor 16.

For example, the capacitance or resistance between two of the conductors may be altered. In this case, the amount of overstress as opposed to whether an overstress occurred may be determined. The capacitance measured may be compared to a predetermined capacitance to determine, for example, what voltage was applied. While this may be achieved using only two conductors, it is probably better achieved using more than two conductors. If the predetermined distances 50-54 are different, then a different voltage may be applied to each of the conductor(s) 36-40 and in one embodiment, the conductor that has the voltage applied to it that is the same as the overstress voltage will short to the first conductor 35. This allows for determination of the voltage that is used for the overstress voltage.

The first to sixth conductors 35 to 40 are surrounded by a dielectric material 45. The dielectric material may be any suitable material, such as silicon dioxide or a high dielectric constant (hi-k) material, such as SiLK. The first to sixth conductors 35 to 40 and the dielectric 45 are surrounded by an isolation structure 32. In one embodiment, the isolation structure 32 is a layer including copper with a barrier layer, such as tantalum nitride or silicon nitride. Other materials, such as silicon nitride, can be used for the isolation structure 32.

The conductors 36 to 40 are coupled to monitor circuitry 61, where in the embodiment illustrated, each of the conductors 36 to 40 are coupled to a detect and disconnect circuit 60 that in turn is coupled to Vdd and register 62. The detect and disconnect circuit 60 supplies Vdd to the conductor and determines when an electrical property of the dielectric 45 is changed or meets a predetermined value.

Although six conductors are illustrated in FIG. 2, the lifetime monitor 16 may include any number of conductors greater than or equal to two. With two conductors an electrical property of the dielectric 45 may be monitored using, for example, monitor circuitry 61, to determine if there has been an overstress of the semiconductor device. One of the conductors (e.g., first conductor 35) is coupled to ground and the other conductor(s) is/are coupled to VDD and monitor circuitry 61. For example, if an overstress occurs by operating the semiconductor device at a voltage of 1.2V, for example, when the semiconductor device is designed to operate at 1V, when VDD is 1.2V, the conductor(s) 36-40 that are coupled to VDD will have a diffusing species diffuse through the dielectric 45 from the conductor(s) 36-40 to the first conductor 35. If the conductors 35-40 include copper, the diffusing species may be copper.

In one embodiment, FIG. 2 is a top-down view of the lifetime monitor 16 so that elements 42, 35-40, and 44 are all formed in the same level of a semiconductor device, such as at the metal 1, 2, etc. layer in the semiconductor device. Transistors and interconnects may be formed directly under or on layers under or within the same layer as the lifetime monitor 16. Passivation and/or additional interconnect layers may be formed inlayers above or even directly above the lifetime monitor 16.

In another embodiment, FIG. 2 is a cross-sectional view and for example, element 35 is formed in one interconnect layer and elements 36-40 are formed in one or more interconnect layer that is different than the interconnect layer that element 35 is formed within. For example, the sixth conductor 40 may be a via formed in a first interconnect layer; the fifth conductor 39 may be a via formed in the second or first and second interconnect layer; the fourth conductor 38 may be a via formed in the third layer or a combination of the first, second, and/or third layer; the third conductor 37 may be a via formed in the fourth layer or a combination of the first, second, third and/or fourth layer; and the second conductor 36 may be a via formed in the fifth layer or a combination of the first, second, third, fourth and/or fifth layer. The first conductor 35 may be formed in an interconnect layer that is above the highest interconnect layer that includes at least a portion of the second conductor 36.

Figure 3:
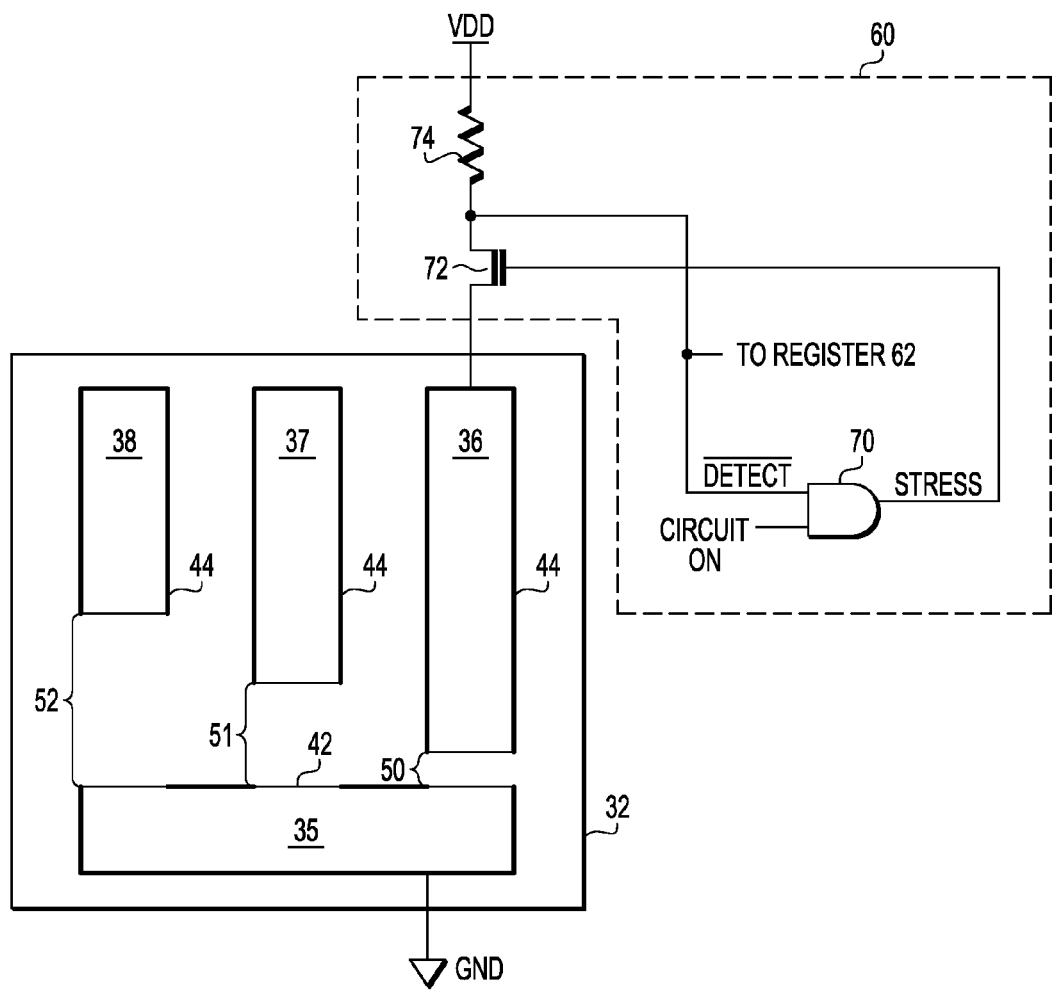
FIG. 3 illustrates a schematic for the detect and disconnect circuit of FIG. 2 in accordance with an embodiment of the present invention.

FIG. 3 illustrates a schematic for the detect and disconnect circuit of FIG. 2 in accordance with an embodiment of the present invention. A resistor 74 is coupled to VDD and a current electrode, such as the drain electrode, of transistor 72. The other current electrode, which may be a source electrode, of transistor 72 is coupled to the conductor 36. The control or gate electrode of the transistor 72 is coupled to and controlled by the stress signal from the AND gate 70, which is coupled to the detectbar signal (the complement of detect) for feedback in case of detection. The detectbar signal is taken from the drain electrode of transistor 72.

In the embodiment illustrated, when one of the predetermined distances 50-52 closes so that there is no longer a gap between the conductor 36, for example, and the conductor 35, the transistor 72 will be turned off so that the conductor 36 is no longer coupled to VDD. (The disappearance of the gap is due to the diffusion of the diffused species into this gap area.) When the circuit is turned on and no electrical signal is detected, detectbar is high and voltage is applied to the conductor 36. When the detectbar node is pulled low due to the dielectric change, the signal is sent to the register 62 and stored and the circuit is disconnected by turning off the transistor 72 to prevent VDD from being further applied to the conductor 36.

Additional conductors can be used to better determine at least two conductors. In the embodiment illustrated, a first conductor 35 is perpendicular to the second to sixth conductors 36-40 and the conductors 35-40 are rectangular in shape. The second to sixth conductors 36-40 are a predetermined distance 50-54, respectively, from the first conductor 35. As illustrated, the predetermined distances 50-54 are different distances. However, the predetermined distances 50-54 may be the same distance. Whether the distances 50-54 are the same or are different may be chosen based on what electrical property is monitored, as will be better understood after further discussion.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. Although the invention has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements Some of the above embodiments, as applicable, may be implemented using a variety of different information processing systems. For example, although FIG. 2 and the discussion thereof describe an exemplary lifetime monitor, this lifetime monitor is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Also for example, in one embodiment, the illustrated elements of the semiconductor device 10 are circuitry located on a single integrated circuit or within a same device. Alternatively, semiconductor device 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A circuit comprising:
a first conductor coupled to a first power supply voltage terminal, wherein the first conductor is surrounded with a first barrier and the first barrier has a first opening that exposes a first area of the first conductor;
a second conductor positioned from the first conductor by an insulating material, wherein:
the second conductor is surrounded with a second barrier,
the second barrier has a second opening that exposes a second area of the second conductor, and
the second opening is aligned to the first opening at a first distance between the first conductor and the second conductor whereby a first gap is present between the first conductor and the second conductor between the first opening and the second opening; and
a first detect and disconnect circuit having a first terminal coupled to the second conductor and a second terminal coupled to a second power supply voltage terminal, the first detect and disconnect circuit for detecting when the first gap between the first opening and the second opening has been closed by diffusion between the first conductor and the second conductor,
wherein the first detect and disconnect circuit comprises:
a logic gate having a first input for receiving an ON signal, a second input, and an output;
a resistor having a first terminal coupled to the second power supply voltage terminal and a second terminal as an output of the first detect and disconnect circuit coupled to the second input of the logic gate, wherein the resistor is distinct from the first conductor and the second conductor; and
a transistor having a first current electrode coupled to the second terminal of the resistor, a second current electrode coupled to the second conductor, and a control electrode coupled to the output of the logic gate.

2. The circuit of claim 1, further comprising:
a third conductor, positioned from the first conductor, wherein:
the third conductor is coated with a third barrier;
the third barrier has a third opening that exposes a third area of the third conductor;
the first barrier has a fourth opening that exposes a fourth area of the first conductor; and
the fourth opening is aligned to the third opening at a second distance between the third conductor and the first conductor whereby a second gap is present between the first conductor and the third conductor between the third opening and the fourth opening; and
a second detect and disconnect circuit having a first terminal coupled to the third conductor and a second terminal coupled to the second power supply voltage terminal, the second detect and disconnect circuit for detecting when the second gap between the third opening and the fourth opening has been closed by diffusion between the first conductor and the third conductor.

3. The circuit of claim 2, wherein the first distance between the first conductor and the second conductor is different than the second distance between the first conductor and the third conductor.

4. The circuit of claim 1, wherein the first conductor, the second conductor, and the third conductor comprise copper, and the first barrier, the second barrier, and the third barrier function as a diffusion barrier to copper.

5. The circuit of claim 2, further comprising a register, the register is for receiving a first stress signal from the first detect and disconnect circuit if the first gap is closed and a second stress signal from the second detect and disconnect circuit if the second gap is closed.

6. The circuit of claim 1, wherein the first and second conductors are implemented using copper over a surface of a semiconductor substrate.

7. The circuit of claim 1, wherein
the output of the logic gate disconnects the first detect and disconnect circuit from the second conductor in response to detecting that the first gap is closed.

8. A circuit comprising:
a first conductor coupled to a first power supply voltage terminal, wherein the first conductor is surrounded with a first barrier having a first opening that exposes a first area of the first conductor and a second opening that exposes a second area of the first conductor;
a second conductor separated from the first conductor by an insulating layer, wherein the second conductor is surrounded with a second barrier having a third opening that exposes a third area of the second conductor, wherein the third opening is aligned to the first opening at a first distance between the first conductor and the second conductor whereby a first gap is present between the first conductor and the second conductor between the first opening and the third opening;

a third conductor, separated from the first conductor by the insulating layer, wherein the second conductor is surrounded with a third barrier having a fourth opening that exposes a fourth area of the third conductor, wherein the fourth opening is aligned to the second opening at a second distance between the first conductor and the third conductor whereby a second gap is present between the first conductor and the third conductor between the second opening and the fourth opening;

a first detect circuit having a first terminal coupled to the second conductor and a second terminal coupled to a second power supply voltage terminal, the first detection circuit for detecting when the first gap between the first opening and the third opening has been closed by diffusion between the first conductor and the second conductor; and a second detect circuit having a first terminal coupled to the third conductor and a second terminal coupled to the second power supply voltage terminal, the second detection circuit for detecting when the second gap between the second opening and the fourth opening has been closed by diffusion between the first conductor and the third conductor, wherein the first detect and disconnect circuit comprises:

a logic gate having a first input for receiving an ON signal, a second input, and an output;

a resistor having a first terminal coupled to the second power supply voltage terminal and a second terminal as an output of the first detect and disconnect circuit coupled to the second input of the logic gate, wherein the resistor is distinct from the first, second, and third conductors; and a transistor having a first current electrode coupled to the second terminal of the resistor, a second current electrode coupled to the second conductor, and a control electrode coupled to the output of the logic gate.

9. The circuit of claim 8, wherein the first, second, and third conductors are formed over a surface of a semiconductor substrate.

10. The circuit of claim 9, wherein the insulating layer forms an isolation structure surrounding the first, second, third conductors.

11. The circuit of claim 8, wherein the first, second, and third conductors comprise copper and the first, second, and third barriers function as a barrier to copper diffusion.

12. The circuit of claim 8, wherein the first distance between the first conductor and the second conductor is different than the second distance between the first conductor and the third conductor.

13. The circuit of claim 8, further comprising a register coupled to the first detect circuit and the second detect, the register comprising at least one bit for storing if the first gap has been closed.

14. The circuit of claim 8, wherein the first power supply voltage terminal is coupled to ground and the second supply voltage terminal is for receiving a positive power supply voltage.

15. The circuit of claim 8, wherein the transistor is an N channel transistor and the logic gate performs an AND function.

16. A method for manufacturing a semiconductor device, the method comprising:

providing a first conductor surrounded with a first barrier having a first opening that exposes a first area of the first conductor, a second conductor surrounded with a second barrier having a second opening that exposes a second area of the second conductor, wherein the second opening is aligned with the first opening at a first distance from the first conductor, the first conductor positioned from the second conductor with an insulating material between the first opening and the second opening whereby a gap is present between the first conductor and the second conductor between the first opening and the second opening;

coupling the first conductor to a first power supply voltage terminal;

coupling the second conductor to a second power supply voltage terminal; and providing a first detect and disconnect circuit for detecting when the gap between the first opening and the second opening has been closed, wherein the first detect and disconnect circuit comprises:

a logic gate having a first input for receiving an ON signal, a second input, and an output;

a resistor having a first terminal coupled to the second power supply terminal and a second terminal as an output of the first detect and disconnect circuit coupled to the second input of the logic gate, wherein the resistor is distinct from the first conductor and the second conductor; and a transistor having a first current electrode coupled to the second terminal of the resistor, a second current electrode coupled to the second conductor, and a control electrode coupled to the output of the logic gate.

17. The method of claim 16, further comprising providing circuitry for setting a bit in a register in response to detecting if the gap has been closed.

* * * * *